(12) United States Patent
Liu et al.

(10) Patent No.: US 11,972,733 B2
(45) Date of Patent: Apr. 30, 2024

(54) LIGHT-EMITTING DEVICE AND DISPLAY PANEL

(71) Applicant: Yungu (Gu'an) Technology Co., Ltd., Hebei (CN)

(72) Inventors: Mengyu Liu, Langfang (CN); Yu Gao, Langfang (CN); Xiaowen Wang, Langfang (CN)

(73) Assignee: Yungu (Gu'an) Technology Co., Ltd., Langfang (CN)

(*) Notice: Subject to any disclaimer, the term of this patent is extended or adjusted under 35 U.S.C. 154(b) by 0 days.

(21) Appl. No.: 18/168,820

(22) Filed: Feb. 14, 2023

(65) Prior Publication Data

US 2023/0186857 A1 Jun. 15, 2023

Related U.S. Application Data

(63) Continuation of application No. PCT/CN2021/118821, filed on Sep. 16, 2021.

(30) Foreign Application Priority Data

Dec. 15, 2020 (CN) .......................... 202011476315.5

(51) Int. Cl.
*G09G 3/20* (2006.01)
*G09G 3/3258* (2016.01)
(Continued)

(52) U.S. Cl.
CPC ......... *G09G 3/3258* (2013.01); *G09G 3/2003* (2013.01); *H10K 50/11* (2023.02);
(Continued)

(58) Field of Classification Search
CPC ............... G09G 3/3258; G09G 3/2003; G09G 2320/0242; H10K 50/11; H10K 50/156;
(Continued)

(56) References Cited

U.S. PATENT DOCUMENTS

| 8,101,290 B2 | 1/2012 | Wang et al. |
| 2019/0165286 A1* | 5/2019 | Li ........................ H10K 85/656 |
| 2020/0194676 A1 | 6/2020 | Chang et al. |

FOREIGN PATENT DOCUMENTS

| CN | 100468816 C | 3/2009 |
| CN | 204289453 U | 4/2015 |

(Continued)

OTHER PUBLICATIONS

English Machine Translation of Schrader, KR 20050040678 (Year: 2023).*

(Continued)

*Primary Examiner* — Donald L Raleigh
(74) *Attorney, Agent, or Firm* — Maier & Maier, PLLC

(57) ABSTRACT

A light-emitting device and a display panel. A light-emitting color of the light-emitting device is a primary color of either red or green, and the light-emitting device includes: a light-emitting layer with a host material; a compensation layer for carrying holes and disposed on a hole injection side of the light-emitting layer; the light-emitting device has a starting state and an operating state, and a starting voltage of the light-emitting device in the starting state is lower than an operating voltage of the light-emitting device in the operating state; in the starting state, there is a first activation energy difference value $\Delta Ea_1$ between activation energies of the host material and the compensation layer, and the first activation energy difference value $\Delta Ea_1 < 0$ eV.

14 Claims, 4 Drawing Sheets

(51) Int. Cl.
  *H10K 50/11*   (2023.01)
  *H10K 50/15*   (2023.01)
  *H10K 50/17*   (2023.01)
  H10K 101/40   (2023.01)

(52) U.S. Cl.
  CPC ........... *H10K 50/156* (2023.02); *H10K 50/17* (2023.02); *G09G 2320/0242* (2013.01); *H10K 2101/40* (2023.02)

(58) Field of Classification Search
  CPC .... H10K 50/17; H10K 2101/40; H10K 59/10; H10K 50/00; H10K 2101/00; H10K 2102/302; H10K 50/10
  See application file for complete search history.

(56) References Cited

FOREIGN PATENT DOCUMENTS

| | | | | |
|---|---|---|---|---|
| CN | 108963093 | A | 12/2018 | |
| CN | 109346500 | A | 2/2019 | |
| CN | 208955023 | U | 6/2019 | |
| CN | 111697146 | A | 9/2020 | |
| CN | 111697147 | A | 9/2020 | |
| KR | 20050040678 | A * | 5/2005 | ............. H01L 51/52 |

OTHER PUBLICATIONS

International Search Report issued on Dec. 14, 2021 of corresponding International application No. PCT/CN2021/118821; 6 pages.

* cited by examiner

LIGHT-EMITTING DEVICE AND DISPLAY PANEL

CROSS-REFERENCE TO RELATED APPLICATION

The present application is a continuation of International Application No. PCT/CN2021/118821 filed on Sep. 16, 2021, which claims priority to Chinese Patent Application No. 202011476315.5, filed on Dec. 15, 2020 and entitled "LIGHT-EMITTING DEVICE AND DISPLAY PANEL", both of which are hereby incorporated by reference in their entireties.

TECHNICAL FIELD

The present application relates to a technical field of display, and in particular to a light-emitting device and a display panel.

BACKGROUND

With the rapid development of electronic devices, due to advantages of high image quality, power saving, thin body and wide application range, organic light-emitting diode (OLED) display panels are widely used in various consumer electronic products such as mobile phones, TVs, personal digital assistants, digital cameras, notebook computers, desktop computers, and have become mainstream display panels in the display field.

The starting voltages of the red, green, and blue light-emitting devices in the OLED display panel are inconsistent. When the display panel is displayed at a low grayscale, the display panel generally cannot maintain a true white light image well, and there is a phenomenon of display color shift.

SUMMARY

In an aspect, an embodiment of the present application provides a light-emitting device, wherein a light-emitting color of the light-emitting device is a primary color of either red or green, and the light-emitting device includes:
a light-emitting layer including a host material;
a compensation layer for carrying holes and disposed on a hole injection side of the light-emitting layer;
the light-emitting device has a starting state and an operating state, and a starting voltage of the light-emitting device in the starting state is lower than an operating voltage of the light-emitting device in the operating state;
in the starting state, there is a first activation energy difference value $\Delta Ea_1$ between activation energies of the host material and the compensation layer, and the first activation energy difference value $\Delta Ea_1 < 0$ eV.

The light-emitting device provided by the embodiment of the present application has a higher starting voltage, and compared with a starting voltage of a blue light-emitting device, the difference is reduced, which avoids the problem of display color shift when the display panel is displayed at a low grayscale, and improves the color rendering accuracy of the display panel.

In another aspect, an embodiment of the present application provides a display panel including the light-emitting device according to the above embodiment of the present application. The display panel provided by the embodiment of the present application has high color rendering accuracy and good display effect.

DETAILED DESCRIPTION

Figure 1:
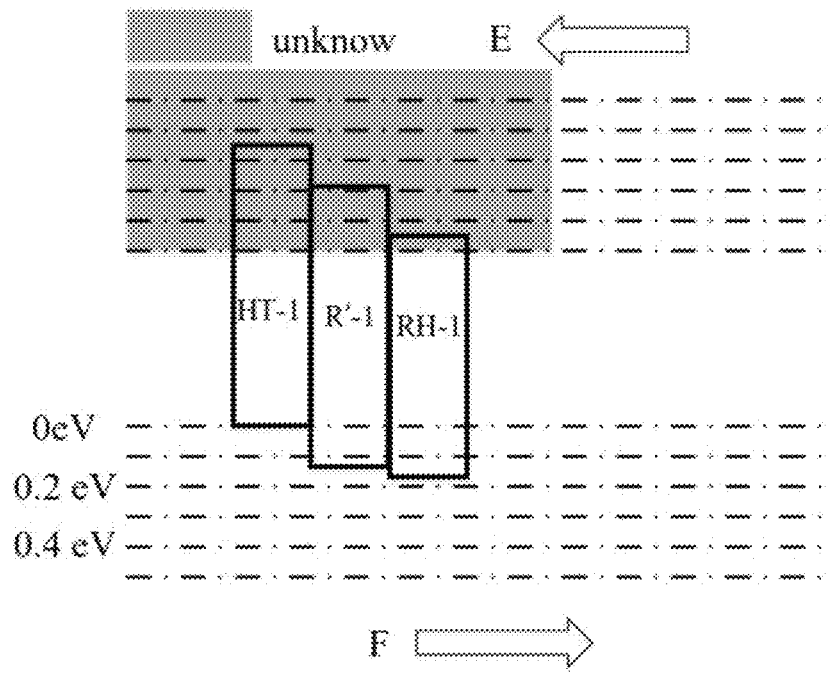
FIG. 1 is a relationship diagram of activation energy levels of functional layers of a first red light-emitting device in a starting state according to a comparative example 1 in an aspect of the present application.

The inventor found in research that during the process of the display panel displaying at a low grayscale, due to the different starting voltages of the red, green and blue light-emitting devices, the display surface of the display panel cannot display a true white light image. When the display panel displays a white screen at the low grayscale, there is a color shift phenomenon of monochromatic impurity and color distortion. According to the formula of $E=hc/\lambda$, the starting voltages of different color light-emitting devices are calculated. Theoretically, the starting voltage of the blue light-emitting device is 2.7V, the starting voltage of the green light-emitting device is 2.34V, and the starting voltage of the red light-emitting device is 2.0V. In the above formula, $h=6.626*10^{-34}$ ($m^2$ kg/s), $c=3*10^8$ (m/s), 1 eV=$1.6*10^{-19}$ (J), J=kg*$m^2/s^2$, the wavelength of blue light is 460 nm, the wavelength of green light is 530 nm, and the wavelength of red light is 520 nm. The starting voltage of the red light-emitting device and the starting voltage of the green light-emitting device are both lower than the starting voltage of the blue light-emitting device. Therefore, starting the blue light-emitting device generates a crosstalk current in the display panel, so that the red and/or green light-emitting device is slightly started, and color shift appears on the display panel.

To this end, in an aspect, an embodiment of the present application provides a light-emitting device, wherein a light-emitting color of the light-emitting device is a primary color of either red or green. The light-emitting device includes: a light-emitting layer including a host material; and a compensation layer for carrying holes and disposed on a hole injection side of the light-emitting layer. The light-emitting device has a starting state and an operating state, and a starting voltage of the light-emitting device in the starting state is lower than an operating voltage of the light-emitting device in the operating state.

In the starting state, there is a first activation energy difference value $\Delta Ea_1$ between activation energies of the host material and the compensation layer, and the first activation energy difference value $\Delta Ea_1 < 0$ eV.

In some optional embodiments, a value of the first activation energy difference value $\Delta Ea_1$ is $-0.12$ eV$\sim -0.08$ eV.

The light-emitting device provided by an aspect of the present application has an improved starting voltage in the starting state, which can resist the impact on its starting state caused by the crosstalk current generated when other light-emitting devices with higher starting voltage (such as blue light-emitting devices) are started. The light-emitting device provided by an aspect of the present application improves the color rendering accuracy of the display panel when the display panel is displayed at a low grayscale, thereby improving the display effect and user experience.

In the embodiments of the present application, the activation energy refers to the potential barrier that needs to be overcome for the transfer of electrons or holes between different functional layers of the light-emitting device. In the embodiments of the present application, the activation energy of a single functional layer or multiple functional layers can be understood as the potential barrier that needs to be overcome for electrons (or holes) flowing from the cathode side (or anode side) through the single functional layer or multiple functional layers. The functional layers refer to the carrier layer and the light-emitting layer in the light-emitting device. The carrier layer in the light-emitting device includes an electron transport layer, a hole blocking layer, a compensation layer, a hole transport layer, a hole injection layer and the like. Alternatively, in the embodiments of the present application, the activation energy can also be understood as the energy required for electrons flowing from the cathode side through the functional layer for carrying electrons, and the energy required for holes flowing from the anode side through the functional layer for carrying holes.

When the functional layer is composed of a single material, the activation energy Ea of the material is the corresponding activation energy Ea of the functional layer. When the functional layer is composed of two or more materials, the calculation method of the activation energy of the functional layer can be as follows: firstly obtaining product values of the activation energies of the materials and the molar mass fractions corresponding to the materials; and then summing the product values to obtain the overall activation energy of the functional layer.

The activation energy can be calculated using the following Arrhenius formula: $Ea = E_0 + mRT$, wherein Ea is the activation energy, $E_0$ and m are temperature-independent constants, T is the temperature, and R is the molar gas constant. That is, it can be seen from the above formula that the activation energy is related to the temperature. In addition, the unit of the activation energy obtained by the above calculation formula is joule J, and the unit of the activation energy can be converted into electron volts eV through a simple conversion formula, and the conversion formula is: 1 eV = $1.602176565 \times 10^{-19}$ J. In the embodiments of the present application, a basic formula for calculating Ea is provided, those skilled in the art can calculate Ea based on the basic Arrhenius formula provided by the embodiments of the application or various variants of the Arrhenius formula.

In some embodiments, calculating the activation energies of the light-emitting layer and the carrier layers on the hole injection side of the light-emitting layer in the light-emitting device, calculating the activation energy difference between the carrier layers on the hole injection side, and calculating the activation energy difference between the light-emitting layer and the carrier layers on the hole injection side can be achieved as follows: fabricating a hole-only device, performing a power-on test on the hole-only device to obtain an I-V curve (i.e., the current-voltage curve) of the hole-only device, and calculating the activation energies based on the obtained I-V curve of the hole-only device by using the Arrhenius formula or various variants of the Arrhenius formula. It should be noted that the hole-only device in the embodiments of the present application only allows holes to pass through.

As a specific example, the difference value $\Delta Ea$ between the activation energies of the hole transport layer and the host material in the light-emitting device is calculated as follows. A first hole-only device having a hole transport layer is fabricated, a power-on test is performed on the first hole-only device to obtain the first I-V curve, and $Ea_1$ of the hole transport layer is calculated by using the Arrhenius formula. A second hole-only device having a hole transport layer and a light-emitting layer (including only a host material) is fabricated, and a power-on test is performed on the second hole-only device, so that holes flow from the hole transport layer to the light-emitting layer, and a second I-V curve is obtained. Eat of the hole transport layer and the light-emitting layer (including only the host material) is calculated by using the Arrhenius formula. The difference value $\Delta Ea$ between the activation energies of the hole transport layer and the host material in the light-emitting device can be calculated by using the difference calculation method, that is, according to $\Delta Ea = Ea_2 - Ea_1$. Hole-only devices allow only holes to pass through.

In some examples, a first hole-only device that allows only holes to pass through is fabricated, the first hole-only device includes an anode, a first hole transport layer, an electron blocking layer, and a cathode, wherein the anode, the first hole transport layer, the electron blocking layer, and the cathode are stacked. A second hole-only device that allows only holes to pass through is fabricated, and the second hole-only device includes an anode, a second hole transport layer, a light-emitting layer (including only the host material), an electron blocking layer, and a cathode, wherein the anode, the second hole transport layer, the light-emitting layer, the electron blocking layer, and the cathode are stacked. Here, the first hole transport layer is the same as the second hole transport layer, and the first hole-only device and the second hole-only device are subjected to the power-on test with only the light-emitting layer (including only the host material) as a single variable. In addition, the electron blocking layer can prevent electrons generated by the cathode from being transported in the hole-only device, thereby achieving the purpose that the hole-only device only allows holes to pass through.

In some embodiments, calculating the activation energies of the light-emitting layer and the carrier layers on the electron injection side of the light-emitting layer in the light-emitting device, calculating the activation energy difference between the carrier layers on the electron injection side, and calculating the activation energy difference between the light-emitting layer and the carrier layers on the electron injection side can be achieved as follows: fabricating an electron-only device, performing a power-on test on the electron-only device to obtain an I-V curve (i.e., the current-voltage curve) of the electron-only device, and calculating the activation energies based on the obtained I-V curve of the electron-only device by using the Arrhenius formula or various variants of the Arrhenius formula.

In the embodiments of the present application, the electron-only device only allows electrons to pass through. As a specific example, the difference value $\Delta Ea'$ between the activation energies of the electron transport layer and the host material in the light-emitting device is calculated as follows. A first electron-only device having a electron transport layer is fabricated, a power-on test is performed on the first electron-only device to obtain the first I-V curve, and $Ea_1'$ of the electron transport layer is calculated by using the Arrhenius formula. A second electron-only device having a electron transport layer and a light-emitting layer (including only a host material) is fabricated, and a power-on test is performed on the second electron-only device, so that electrons flow from the electron transport layer to the light-emitting layer, and a second I-V curve is obtained. $Ea_2'$ of the electron transport layer and the light-emitting layer (including only the host material) is calculated by using the Arrhenius formula. The difference value $\Delta Ea'$ between the activation energies of the electron transport layer and the host material in the light-emitting device can be calculated by using the difference calculation method, that is, according to $\Delta Ea'=Ea_2'-Ea_2'$.

In some examples, a first electron-only device that allows only electrons to pass through is fabricated, the first electron-only device includes an anode, a hole blocking layer, a first electron transport layer, and a cathode, wherein the anode, the hole blocking layer, the first electron transport layer, and the cathode are stacked. A second electron-only device that allows only electrons to pass through is fabricated, and the second electron-only device includes an anode, a hole blocking layer, a light-emitting layer (including only the host material), a second electron transport layer, and a cathode, wherein the anode, the hole blocking layer, the light-emitting layer, the second electron transport layer, and the cathode are stacked. Here, the first electron transport layer is the same as the second electron transport layer, and the first electron-only device and the second electron-only device are subjected to the power-on test with only the light-emitting layer (including only the host material) as a single variable. The hole blocking layer can prevent holes generated by the anode from being transported in the electron-only device, thereby achieving the purpose that the electron-only device only allows electrons to pass through.

In other embodiments, the activation energies of the functional layers can be obtained by a thermogravimetric analysis. For example, thermogravimetric analysis is respectively performed on the hole transport layer, the compensation layer, or the host material in the light-emitting layer, and the activation energies of the functional layers is directly calculated according to the result of the thermogravimetric analysis. The thermogravimetric analysis refers to an analysis method that obtains a relationship between a mass of a substance and the changing temperature (or time) under program-controlled temperatures. After using the thermogravimetric analysis technique to obtain a thermogravimetric curve, the average activation energy can be calculated by a Freeman-Carroll method or OWAZa method.

Generally, the highest occupied molecular orbital HOMO and the lowest unoccupied molecular orbital LUMO are used to measure the energy level matching of the functional layers in the light-emitting device. The materials of the functional layers of the light-emitting device in the OLED display panel are selected according to the energy level matching predicted from the highest occupied molecular orbital HOMO and the lowest unoccupied molecular orbital LUMO. The HOMO and LUMO only consider the carrier injection efficiency, and do not comprehensively consider the influence of other factors such as temperature and carrier transport on the transfer of the carriers in the functional layers. Therefore, using the highest occupied molecular orbital HOMO and the lowest unoccupied molecular orbital LUMO to measure the energy level matching of the functional layers in the light-emitting device is likely to cause large deviations in the calculation results of the energy level difference between the functional layers, and the expected light-emitting device cannot be designed.

However, in the embodiments of the present application, the light-emitting devices are designed by using the activation energies of the functional layers in the light-emitting device and the activation energy difference value between the functional layers. Many factors such as the injection of the carriers and the transfer of the carriers between the functional layers in the light-emitting device, temperature and the like are comprehensively considered. The difference value relationship between the activation energies of the functional layers in the light-emitting device in the starting state and/or the operating state (that is, the energy barrier relationship between the functional layers) can be more accurately and precisely defined. According to the difference value relationship between the activation energies of the functional layers of the light-emitting device in the embodiments of the present application, the problem that the starting voltage of the red or green light-emitting device in the starting state is too low can be better solved. Further, the problem of display color shift when the display panel is displayed at a low grayscale caused by the light-emitting device being affected by the crosstalk current can be better solved.

In some optional embodiments, in the light-emitting device provided by an aspect of the present application, a value of a first activation energy difference value $\Delta Ea_1$ is $-0.12$ eV$\sim$$-0.08$ eV.

In some optional embodiments, the light-emitting device further includes a hole transport layer disposed on the hole injection side of the light-emitting layer, and the compensation layer is disposed between the hole transport layer and the light-emitting layer. The hole transport layer and the compensation layer in the light-emitting device are both used for carrying holes. In the starting state, the activation energy of the compensation layer is higher than activation energies of the hole transport layer and the host material. In these embodiments, the compensation layer in the light-emitting device is equivalent to a hole transport barrier layer between the hole transport layer and the host material when the light-emitting device is in the starting state. In order to transfer the holes from the hole transport layer to the light-emitting layer across the activation energy level of the compensation layer, it is necessary to apply more current to the light-emitting device to realize the transfer of the holes from the hole transport layer to the light-emitting material of the light-emitting layer. Applying more current in the light-emitting process of the light-emitting device means that more voltage needs to be applied to the light-emitting device to realize the transfer of the holes from the hole transport layer to the light-emitting material of the light-emitting layer. Therefore, it can further help to increase the starting voltage of the light-emitting device.

In some optional embodiments, in the starting state of the light-emitting device, there is a second activation energy difference value $\Delta Ea_2$ between activation energies of the compensation layer and the hole transport layer, and a value range of the second activation energy difference value $\Delta Ea_2$ is 0.2 eV~0.3 eV.

In some optional embodiments, in the starting state of the light-emitting device, there is a third activation energy difference value $\Delta Ea_3$ between the host material and the hole transport layer, and a value range of the $\Delta Ea_3$ is 0.1 eV~0.2 eV.

In some optional embodiments, in the starting state, there is a first activation energy difference value $\Delta Ea_1$ between activation energies of the host material and the compensation layer of the light-emitting device, and $\Delta Ea_1 < 0$ eV. In the operating state of the light-emitting device, there is a fourth activation energy difference value $\Delta Ea_4$ between the host material and the compensation layer of the light-emitting device, and the fourth activation energy difference value $\Delta Ea_4 > 0$ eV.

In some embodiments, a value range of the fourth activation energy difference value $\Delta Ea_4$ is 0 eV~0.05 eV. In these embodiments, the starting voltage of the light-emitting device in the starting state is increased, while the operating voltage of the light-emitting device in the operating state (also referred to as the driving state or the working state) remains basically unchanged.

In these embodiments, the increase of the starting voltage of the light-emitting device can avoid the wrong starting of the light-emitting device due to the influence of the crosstalk current, can avoid the color shift of the display panel (especially at low grayscale and low brightness), and can improve the display precision. When the light-emitting device is in the operating state, the operating voltage of the light-emitting device remains basically unchanged, which can ensure that parameters such as light-emitting efficiency and light-emitting brightness of the light-emitting device are not affected, and can further ensure the display effect of the display panel. The light-emitting device is in a low grayscale in the starting state, and the light-emitting brightness of the light-emitting device in the starting state is lower than the light-emitting brightness of the light-emitting device in the operating state. The light-emitting device is in a high grayscale in the operating state, and the light-emitting brightness of the light-emitting device in the operating state is higher than the light-emitting brightness of the light-emitting device in the starting state.

In some examples, the low grayscale ranges from 0 grayscale to 64 grayscale, and the high grayscale ranges from 250 grayscale to 255 grayscale. Theoretically, the starting voltage of the blue light-emitting device is 2.7V, the starting voltage of the green light-emitting device is 2.34V, and the starting voltage of the red light-emitting device is 2.0V. Generally, the value range of the operating voltage of the blue, green and red light-emitting devices is 3.5V to 4.0V, the operating voltage of the blue light-emitting device is higher than the operating voltage of green light-emitting device, and the operating voltage of green light-emitting devices is higher than the operating voltage of the red light-emitting device.

In some optional embodiments, in the operating state, the activation energy of the hole transport layer stacked on the hole injection side of the compensation layer in the light-emitting device is lower than the activation energy of the compensation layer. Further, there is a fourth activation energy difference value $\Delta Ea_4$ between the host material and the compensation layer of the light-emitting device, and the fourth activation energy difference value $\Delta Ea_4 > 0$ eV. That is, the activation energy of the compensation layer is between the activation energies of the hole transport layer and the host material of the light-emitting layer. In these optional embodiments, the activation energy of the compensation layer is between the activation energies of the hole transport layer and the host material, so that the operating voltage of the light-emitting device in the operating state remains basically unchanged and does not increase. The light-emitting efficiency of the light-emitting device is guaranteed while avoiding excessive power consumption of the light-emitting device. Further, the activation energy of the compensation layer is between the activation energy of the hole transport layer and the activation energy of the host material, which is equivalent to forming a hole injection energy level buffer layer between the hole transport layer and the host material. Therefore, the efficiency and quality of the transfer of the holes from the hole transport layer to the host material is further improved. The interface impact between the host material and the hole transport layer due to the large activation energy difference can be avoided, and the life of the light-emitting device is improved.

In some optional embodiments, when the light-emitting device is in the operating state, there is a fifth activation energy difference value $\Delta Ea_5$ between the activation energies of the compensation layer and the hole transport layer, and a value range of the fifth activation energy difference value $\Delta Ea_5$ is 0.08 eV~0.12 eV.

In some optional embodiments, when the light-emitting device is in the operating state, there is a sixth activation energy difference value $\Delta Ea_6$ between the activation energies of the host material of the light-emitting layer and the hole transport layer, and a value range of $\Delta Ea_6$ is 0.1 eV~0.2 eV.

In some embodiments, when the light-emitting device is in the operating state, a value range of the fourth activation energy difference value $\Delta Ea_4$ between the activation energies of the host material and the compensation layer is 0 eV~0.05 eV.

In some optional embodiments, the light-emitting layer of the light-emitting device includes a host material and a guest material doped in the host material.

In some embodiments, the light-emitting device includes a hole injection layer, a hole transport layer, and a compensation layer disposed on a hole injection side of the light-emitting layer and stacked in a hole injection direction of the light-emitting layer. The light-emitting device further includes an electron transport layer and a hole blocking layer disposed on an electron injection side of the light-emitting layer and stacked in an electron injection direction of the light-emitting layer.

In order to further demonstrate the effect of the light-emitting device provided in the aspect of the present application on solving the low grayscale color shift of the display panel, the following two groups of comparative experiments are designed. The first group of experiments is the test experiment of the starting voltage and the operating voltage of the red light-emitting device. The second group of experiments is the test experiment of the starting voltage and the operating voltage of the green light-emitting device.

Figure 2:
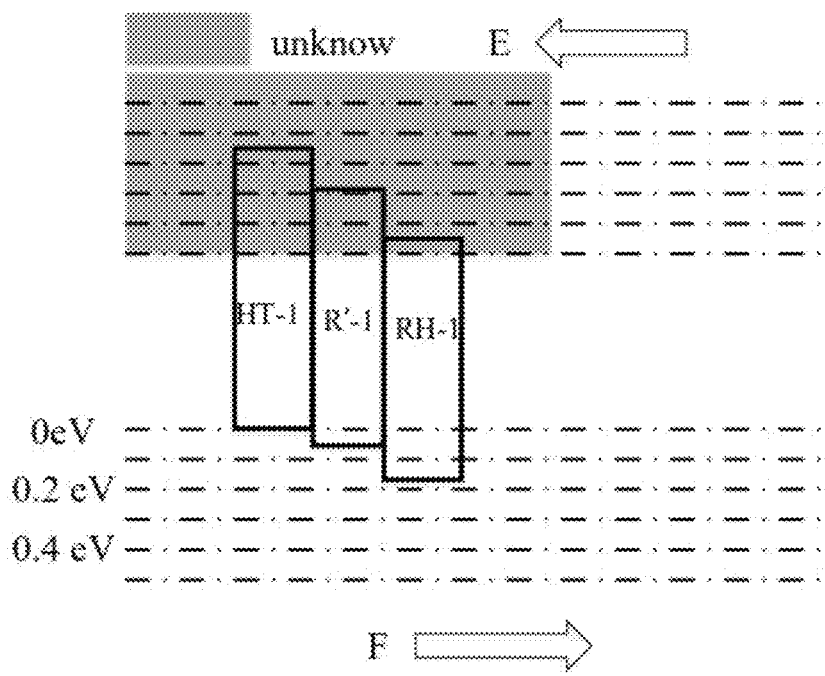
FIG. 2 is a relationship diagram of activation energy levels of functional layers of the first red light-emitting device in an operating state according to the comparative example 1 in an aspect of the present application.

The first group of experiments includes a comparative example 1 and an experimental example 1. In the comparative example 1, a first red light-emitting device including a hole transport layer, a compensation layer and a light-emitting layer is fabricated, and the starting voltage and the operating voltage thereof are tested. Further, in the comparative example 1, the light-emitting layer in the first red light-emitting device has a first red host material. In the comparative example 1, when the first red light-emitting device is in the starting state, the relationship between the activation energies of the hole transport layer, the compensation layer, and the light-emitting layer is shown in FIG. 1, wherein HT-1 represents the hole transport layer, R'-1 represents the red compensation layer, and RH-1 represents the red host material. Further, F represents the hole injection direction, and E represents the electron injection direction. In the hole injection direction, the activation energy of the hole transport layer is less than the activation energy of the compensation layer, and the activation energy of the compensation layer is less than the activation energy of the red host material. In the comparative example 1, when the first red light-emitting device is in the operating state, the relationship between the activation energies of the hole transport layer, the compensation layer, and the light-emitting layer is shown in FIG. 2. In the hole injection direction, the activation energy of the hole transport layer is less than the activation energy of the compensation layer, and the activation energy of the compensation layer is less than the activation energy of the red host material.

Figure 3:
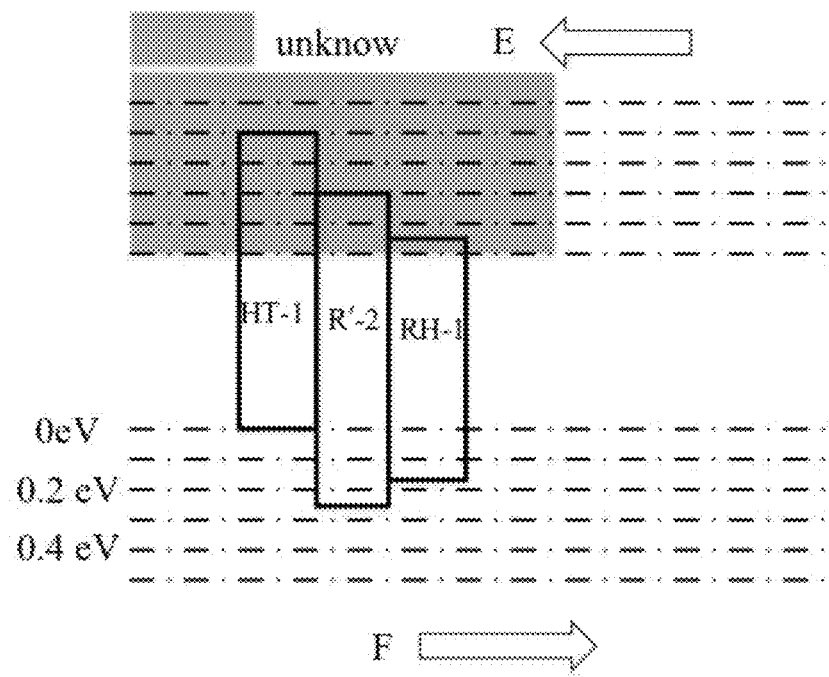
FIG. 3 is a relationship diagram of activation energy levels of functional layers of a second red light-emitting device in a starting state according to an experimental example 1 in an aspect of the present application.
Figure 4:
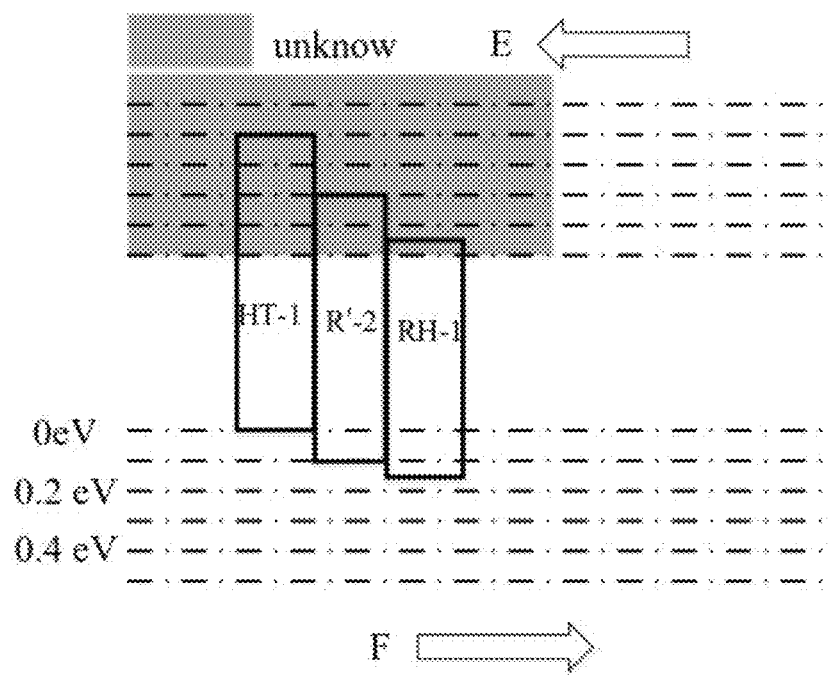
FIG. 4 is a relationship diagram of activation energy levels of functional layers of the second red light-emitting device in an operating state according to the experimental example 1 in an aspect of the present application.

In the experimental example 1 of the first group of experiments, a second red light-emitting device including a hole transport layer, a compensation layer and a light-emitting layer is fabricated, and the starting voltage and the operating voltage thereof are tested. Further, in the experimental example 1, the light-emitting layer has a first red host material, and in the second red light-emitting device of the experimental example 1, except that the compensation layer is different from the compensation layer in the comparative example 1, the rest of the functional layers are the same. That is, in the experimental example 1 and the comparative example 1, only the compensation layer is used as a variable. In the experimental example 1, when the second red light-emitting device is in the starting state, the relationship between the activation energies of the hole transport layer, the compensation layer, and the light-emitting layer is shown in FIG. 3. In the hole injection direction, the activation energy of the hole transport layer is less than the activation energy of the first red host material, and the activation energy of the compensation layer is higher than the activation energies of the first red host material and the hole transport layer. In the experimental example 1, when the second red light-emitting device is in the operating state, the relationship between the activation energies of the hole transport layer, the compensation layer, and the light-emitting layer is shown in FIG. 4. In the hole injection direction, the activation energy of the hole transport layer is less than the activation energy of the compensation layer, and the activation energy of the compensation layer is less than the activation energy of the first red host material.

Table 1 is the test experimental results of the comparative example 1 and the experimental example 1.

| | starting state | operating state | Von@4 grayscale (V) | Von@255 grayscale (V) | Eff. (cd/A) |
|---|---|---|---|---|---|
| comparative example 1 | $\Delta Ea_1 > 0$ eV | $\Delta Ea_4 > 0$ eV | 2.07 | 3.33 | 54.8 |
| experimental example 1 | $\Delta Ea_1 < 0$ eV | $\Delta Ea_4 > 0$ eV | 2.31 | 3.30 | 53.3 |

In Table 1, Von represents the starting voltage, Vd represents the operating voltage, and Eff. represents the efficiency (cd/A). It can be seen from Table 1 that the starting voltage of the experimental example 1 is increased by 0.24V with respect to the starting voltage of the comparative example 1. Further, the difference between the operating voltages of the experimental example 1 and the comparative example 1 is −0.03V, which represents that the operating voltage of the experimental example 1 is basically the same as the operating voltage of the comparative example 1. Therefore, in the first group of experiments, it can be clearly concluded that the light-emitting device of the embodiments of the present application increases the starting voltage in the starting state, and at the same time, the operating voltage in the operating state remains basically unchanged. Thus, the light-emitting device can resist the negative impact of the crosstalk current when the display panel is displayed at a low grayscale, and can avoid the problem of display color shift of the display panel. Further, the color rendering accuracy of the display panel (especially at low grayscale) is improved.

Figure 5:
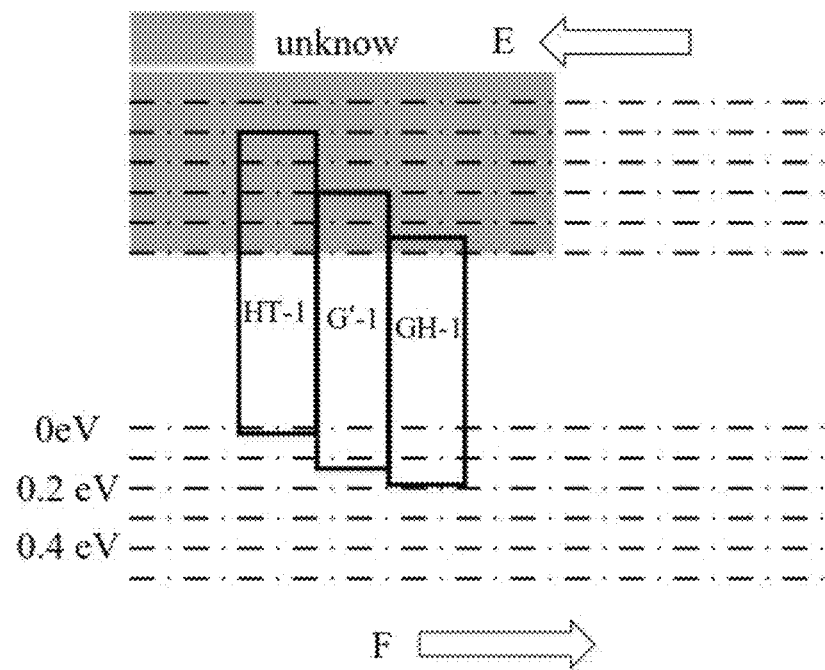
FIG. 5 is a relationship diagram of activation energy levels of functional layers of a first green light-emitting device in a starting state according to a comparative example 2 in an aspect of the present application.
Figure 6:
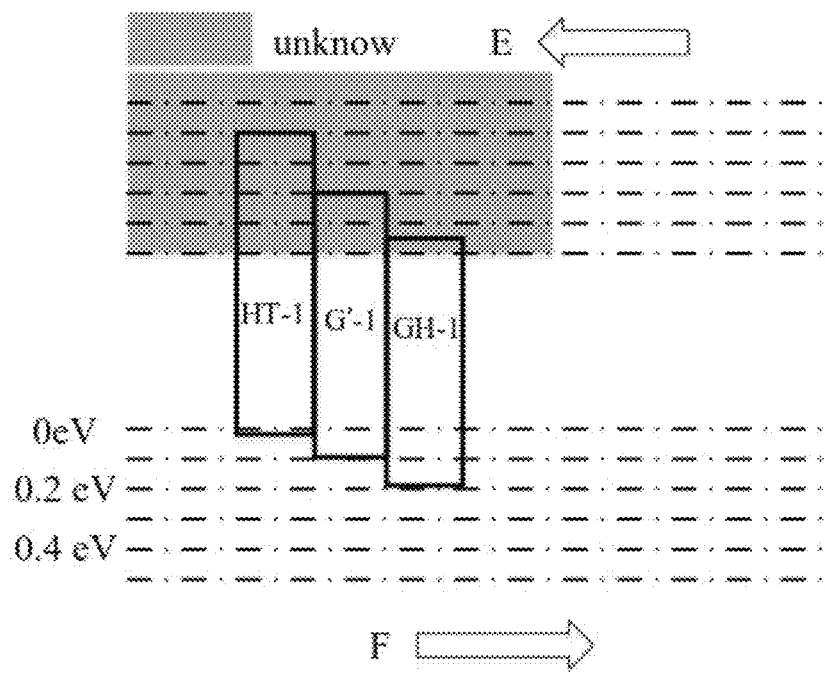
FIG. 6 is a relationship diagram of activation energy levels of functional layers of the first green light-emitting device in an operating state according to the comparative example 2 in an aspect of the present application.

The second group of experiments includes a comparative example 2 and an experimental example 2. In the comparative example 2, a first green light-emitting device including a hole transport layer, a compensation layer and a light-emitting layer is fabricated, and the starting voltage and the operating voltage thereof are tested. Further, in the comparative example 2, the light-emitting layer in the hole-only device has a first green host material. In the comparative example 2, when the first green light-emitting device is in the starting state, the relationship between the activation energies of the hole transport layer, the compensation layer, and the light-emitting layer is shown in FIG. 5. In the hole injection direction, the activation energy of the hole transport layer is less than the activation energy of the compensation layer, and the activation energy of the compensation layer is less than the activation energy of the first green host material. In the comparative example 2, when the first green light-emitting device is in the operating state, the relationship between the activation energies of the hole transport layer, the compensation layer, and the light-emitting layer is shown in FIG. 6. In the hole injection direction, the activation energy of the hole transport layer is less than the activation energy of the compensation layer, and the activation energy of the compensation layer is less than the activation energy of the first green host material.

Figure 7:
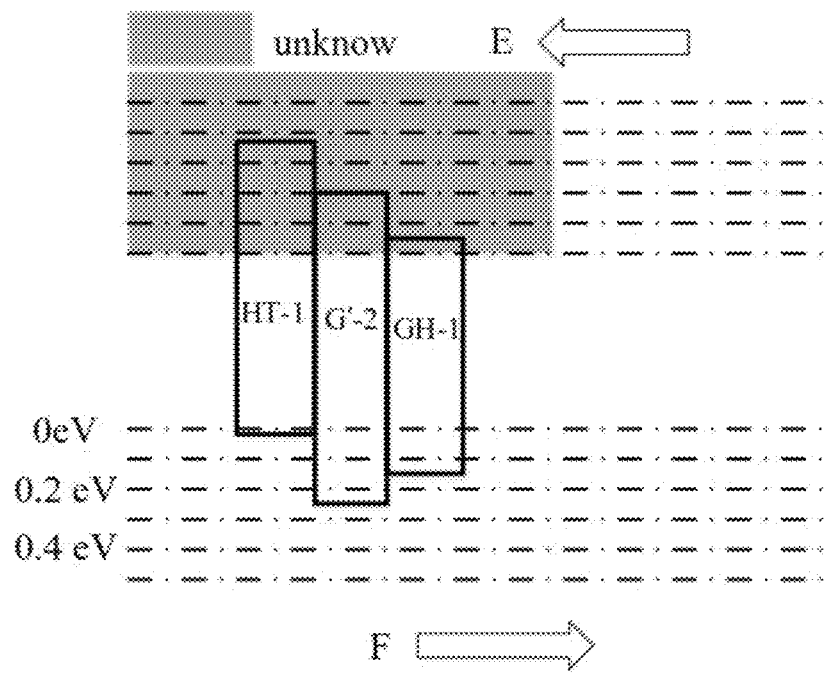
FIG. 7 is a relationship diagram of activation energy levels of functional layers of a second green light-emitting device in a starting state according to an experimental example 2 in an aspect of the present application.
Figure 8:
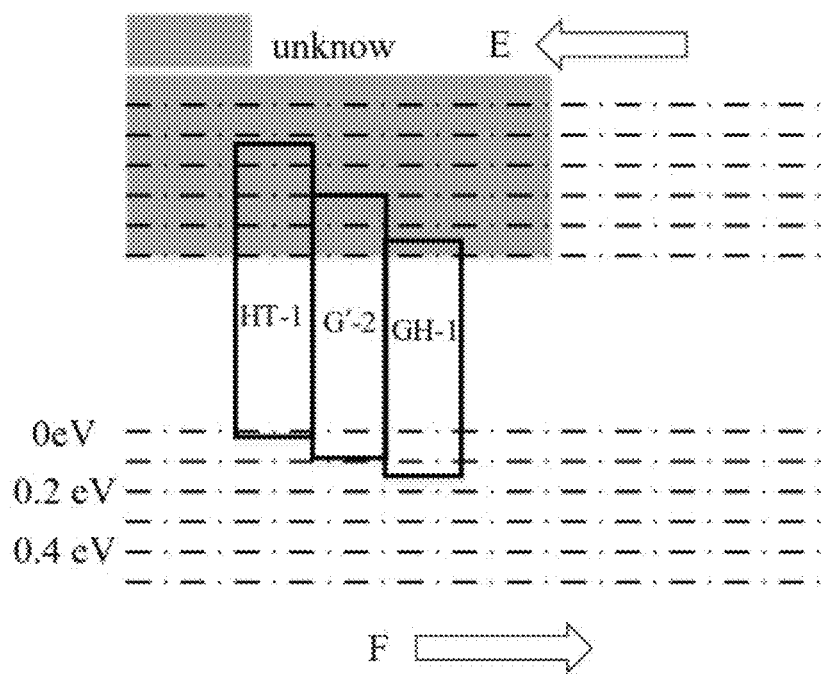
FIG. 8 is a relationship diagram of activation energy levels of functional layers of the second green light-emitting device in an operating state according to the experimental example 2 in an aspect of the present application.

In the experimental example 2 of the second group of experiments, a second green light-emitting device including a hole transport layer, a compensation layer and a light-emitting layer is fabricated, and the starting voltage and the operating voltage thereof are tested. Further, in the experimental example 2, the light-emitting layer has a first green host material, and in the second green light-emitting device of the experimental example 2, except that the compensation layer is different from the compensation layer in the comparative example 2, the rest of the functional layers are the same. That is, in the experimental example 2 and the comparative example 2, only the compensation layer is used as a variable. In the experimental example 2, when the second green light-emitting device is in the starting state, the relationship between the activation energies of the hole transport layer, the compensation layer, and the light-emitting layer is shown in FIG. 7. In the hole injection direction, the activation energy of the hole transport layer is less than the activation energy of the first green host material, and the activation energy of the compensation layer is higher than the activation energies of the first green host material and the hole transport layer. In the experimental example 2, when the second green light-emitting device is in the operating state, the relationship between the activation energies of the hole transport layer, the compensation layer, and the light-emitting layer is shown in FIG. 8. In the hole injection direction, the activation energy of the hole transport layer is less than the activation energy of the compensation layer, and the activation energy of the compensation layer is less than the activation energy of the first green host material.

Table 2 is the test experimental results of the comparative example 2 and the experimental example 2.

| | starting state | operating state | Von@4 grayscale (V) | Von@255 grayscale (V) | Eff. (cd/A) |
|---|---|---|---|---|---|
| comparative example 2 | $\Delta Ea_1 >$ 0 eV | $\Delta Ea_4 >$ 0 eV | 2.18 | 3.58 | 160.1 |
| experimental example 2 | $\Delta Ea_1 <$ 0 eV | $\Delta Ea_4 >$ 0 eV | 2.35 | 3.53 | 161.0 |

In Table 2, Von represents the starting voltage, Vd represents the operating voltage, and Eff. represents the efficiency (cd/A). It can be seen from Table 2 that the starting voltage of the experimental example 2 is increased by 0.17V with respect to the starting voltage of the comparative example 2. Further, the difference between the operating voltages of the experimental example 2 and the comparative example 2 is −0.05V, which represents that the operating voltage of the experimental example 2 is basically the same as the operating voltage of the comparative example 2. Therefore, in the second group of experiments, it can be clearly concluded that the light-emitting device of the embodiments of the present application increases the starting voltage in the starting state, and the operating voltage in the operating state remains basically unchanged. Thus, the light-emitting device can resist the negative impact of the crosstalk current when the display panel is displayed at a low grayscale, and can avoid the problem of display color shift of the display panel. Further, the color rendering accuracy of the display panel (especially at low grayscale) is improved.

In another aspect, an embodiment of the present application provides a display panel including the light-emitting device according to the above embodiment of the present application. The display panel provided by the embodiment of the present application has high color rendering accuracy and good display effect.

What is claimed is:

1. A light-emitting device, wherein a light-emitting color of the light-emitting device is a primary color of either red or green, and the light-emitting device comprises:
   a light-emitting layer comprising a host material, and
   a compensation layer for carrying holes and disposed on a hole injection side of the light-emitting layer;
   wherein the light-emitting device has a starting state and an operating state, and a starting voltage of the light-emitting device in the starting state is lower than an operating voltage of the light-emitting device in the operating state;
   wherein, in the starting state, there is a first activation energy difference value $\Delta Ea1$ between activation energies of the host material and the compensation layer, and the first activation energy difference value $\Delta Ea1<0$ eV;
   wherein the light-emitting device further comprises a hole transport layer disposed on the hole injection side of the light-emitting layer, and the compensation layer is disposed between the hole transport layer and the light-emitting layer;
   wherein, in the starting state, the activation energy of the compensation layer is higher than activation energies of the hole transport layer and the host material; and
   wherein in the starting state, there is a second activation energy difference value $\Delta Ea2$ between activation energies of the compensation layer and the hole transport layer, and a value range of the second activation energy difference value $\Delta Ea2$ is 0.2 eV~0.3 eV.

2. The light-emitting device according to claim 1, wherein a value of the first activation energy difference value $\Delta Ea1$ is −0.12 eV~−0.08 eV.

3. The light-emitting device according to claim 1, wherein the light-emitting device further comprises:
   a hole injection layer disposed on the hole injection side of the light-emitting layer, wherein along a hole injection direction of the light-emitting layer, the hole injection layer, the hole transport layer and the compensation layer are successively stacked.

4. The light-emitting device according to claim 1, wherein the light-emitting layer further comprises a guest material doped in the host material.

5. A display panel comprising the light-emitting device according to claim 1.

6. A light-emitting device, wherein a light-emitting color of the light-emitting device is a primary color of either red or green, and the light-emitting device comprises:
   a light-emitting layer comprising a host material, and
   a compensation layer for carrying holes and disposed on a hole injection side of the light-emitting layer;
   wherein the light-emitting device has a starting state and an operating state, and a starting voltage of the light-emitting device in the starting state is lower than an operating voltage of the light-emitting device in the operating state;
   wherein, in the starting state, there is a first activation energy difference value $\Delta Ea1$ between activation energies of the host material and the compensation layer, and the first activation energy difference value $\Delta Ea1<0$ eV;
   wherein the light-emitting device further comprises a hole transport layer disposed on the hole injection side of the light-emitting layer, and the compensation layer is disposed between the hole transport layer and the light-emitting layer;
   wherein, in the starting state, the activation energy of the compensation layer is higher than activation energies of the hole transport layer and the host material; and
   wherein, in the starting state, there is a third activation energy difference value $\Delta Ea3$ between activation energies of the host material and the hole transport layer, and a value range of the $\Delta Ea3$ is 0.1 eV~0.2 eV.

7. A display panel comprising the light-emitting device according to claim 6.

8. A light-emitting device, wherein a light-emitting color of the light-emitting device is a primary color of either red or green, and the light-emitting device comprises:
   a light-emitting layer comprising a host material, and
   a compensation layer for carrying holes and disposed on a hole injection side of the light-emitting layer;
   wherein the light-emitting device has a starting state and an operating state, and a starting voltage of the light-emitting device in the starting state is lower than an operating voltage of the light-emitting device in the operating state;
   wherein, in the starting state, there is a first activation energy difference value $\Delta Ea1$ between activation energies of the host material and the compensation layer, and the first activation energy difference value $\Delta Ea1<0$ eV; and
   wherein, in the operating state, there is a fourth activation energy difference value $\Delta Ea4$ between activation energies of the host material and the compensation layer, and the fourth activation energy difference value ΔEa4>0 eV.

9. The light-emitting device according to claim 8, wherein the activation energy of the compensation layer is between the activation energies of the hole transport layer and the host material.

10. The light-emitting device according to claim 8, wherein a value range of the fourth activation energy difference value ΔEa4 is 0 eV~0.05 eV.

11. The light-emitting device according to claim 9, wherein
in the operating state, the activation energy of the hole transport layer stacked on a hole injection side of the compensation layer is lower than the activation energy of the compensation layer.

12. The light-emitting device according to claim 11, wherein
in the operating state, there is a fifth activation energy difference value ΔEa5 between the activation energies of the compensation layer and the hole transport layer, and a value range of the fifth activation energy difference value ΔEa5 is 0.08 eV~0.12 eV.

13. The light-emitting device according to claim 12, wherein in the operating state, there is a sixth activation energy difference value ΔEa6 between the activation energies of the host material and the hole transport layer, and a value range of the sixth activation energy difference value ΔEa6 is 0.1 eV~0.2 eV.

14. A display panel comprising the light-emitting device according to claim 8.

* * * * *